United States Patent
Sailer et al.

(10) Patent No.: US 7,383,492 B2
(45) Date of Patent: Jun. 3, 2008

(54) FIRST-IN/FIRST-OUT (FIFO) INFORMATION PROTECTION AND ERROR DETECTION METHOD AND APPARATUS

(75) Inventors: Philip M. Sailer, Needham, MA (US); Nicholas Paluzzi, Hopkinton, MA (US); Avinash Kallat, Marlborough, MA (US); Stephen L. Scaringella, Holliston, MA (US); Krzysztof Dobecki, Framingham, MA (US)

(73) Assignee: EMC Corporation, Hopkinton, MA (US)

( * ) Notice: Subject to any disclaimer, the term of this patent is extended or adjusted under 35 U.S.C. 154(b) by 806 days.

(21) Appl. No.: 10/392,626

(22) Filed: Mar. 20, 2003

(65) Prior Publication Data

US 2004/0187053 A1 Sep. 23, 2004

(51) Int. Cl.
 *G06F 11/00* (2006.01)
 *H03M 13/00* (2006.01)
 *G11C 29/00* (2006.01)

(52) U.S. Cl. .............. 714/801; 714/776; 714/719

(58) Field of Classification Search ........... 714/800, 714/801, 758, 730, 804, 738
See application file for complete search history.

(56) References Cited

U.S. PATENT DOCUMENTS 4,333,143 A * 6/1982 Calder .................. 710/53
5,305,321 A * 4/1994 Crayford ................ 370/389
5,349,683 A * 9/1994 Wu et al. ............... 714/801
5,446,873 A * 8/1995 Chan ...................... 714/1
5,872,802 A * 2/1999 Knaack et al. ........... 714/800
5,974,584 A * 10/1999 Hendrickson et al. ..... 714/800
6,295,620 B1 * 9/2001 Togo ..................... 714/719
6,397,273 B2 * 5/2002 Chilton ................... 710/52
6,493,794 B1 * 12/2002 Yamashita .............. 711/109
6,742,159 B2 * 5/2004 Sakurai .................. 714/801
6,993,705 B1 * 1/2006 MacLellan .............. 714/800
7,043,673 B1 * 5/2006 Ichiriu et al. ............ 714/719
2002/0064186 A1 * 5/2002 Aoyagi et al. ........... 370/521

* cited by examiner

Primary Examiner—Phung M. Chung

(57) ABSTRACT

A system and method for determining data integrity as such data passes through a FIFO. A generator is provided for appending a bit in a predetermined bit location in each packet pushed into the FIFO in response clock signals. The appended bit is a function of the information pushed into the FIFO. A checker is provided for providing an indication of the information integrity in response to bits produced at an output of the FIFO in the predetermined bit location. In one embodiment, the generator is a parity generator and the checker is a parity checker. In one embodiment, during an initial test mode, one parity type is introduced into the FIFO by the parity generator and the opposite parity type is checked at the output of the FIFO by the parity checker to determine whether the parity checker is able to produce parity error signals. In another embodiment, the generator is a packet delimiter generator and the checker is a packet delimiter checker. In another embodiment, the generator is a frame delimiter generator and the checker is a frame delimiter checker.

10 Claims, 1 Drawing Sheet

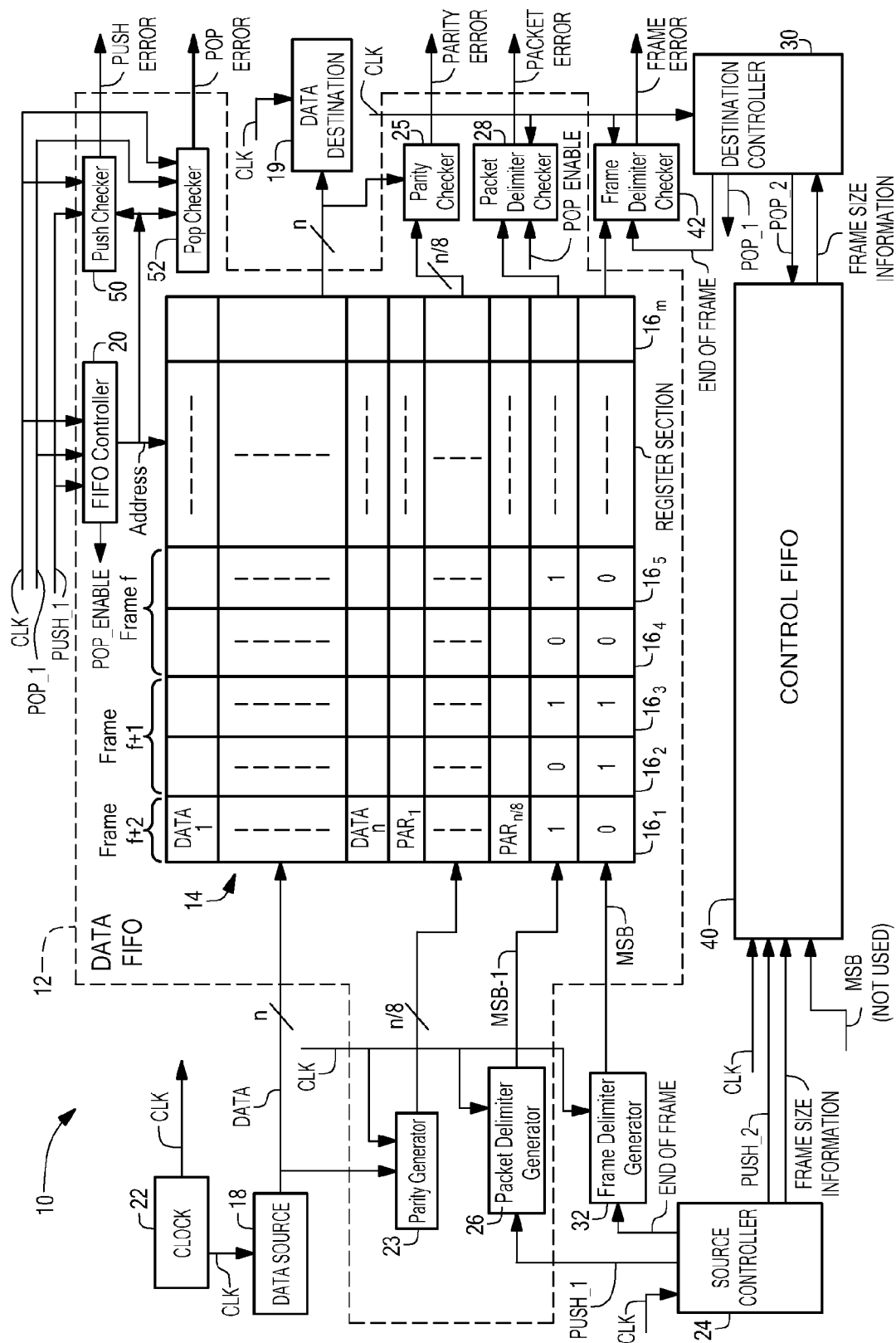

FIRST-IN/FIRST-OUT (FIFO) INFORMATION PROTECTION AND ERROR DETECTION METHOD AND APPARATUS

TECHNICAL FIELD

This invention relates to first-in/first-out register file (FIFO) error detection methods and apparatus.

BACKGROUND

As is known in the art, FIFOs are used extensively in digital systems such as computers, signal processors, etc. to pass data and/or control, i.e., information, from one part of the system to another. In these systems, it is important to confirm that the information introduced ("pushed" or written) into the FIFO is the same as the data received ("popped" or read) from the FIFO.

More particularly, a FIFO includes a plurality of storage stages. These storage stages may be a series of shift register stages or addressable stages. In either case, the information first written into the FIFO is the first information read from the FIFO. With a series of shift register stages, the information data is pushed into the input register stage in response to shift signals and any information previously residing in the FIFO is shifted into the next highest register stage, such shift signals being produced synchronous with a clock signal pushed into the FIFO. A "pop", or read address is applied to the FIFO that points to the oldest data in the FIFO. It is also important to confirm that the correct amount of information is popped from the FIFO.

SUMMARY

In accordance with the present, a system and method for confirming the integrity of information passes through a FIFO. A generator is provided for appending a bit in a predetermined bit location in each packet pushed into the FIFO in response clock signals. The appended bit is a function of the information pushed into the FIFO. A checker is provided for providing an indication of the information integrity in response to bits produced at an output of the FIFO in the predetermined bit location.

In one embodiment, the generator is a parity generator and the checker is a parity checker.

In one embodiment, during an initial test mode, one parity type is introduced into the FIFO by the parity generator and the opposite parity type is checked at the output of the FIFO by the parity checker to determine whether the parity checker is able to produce parity error signals.

In another embodiment, the generator is a packet delimiter generator and the checker is a packet delimiter checker.

In another embodiment, the generator is a frame delimiter generator and the checker is a frame delimiter checker.

The details of one or more embodiments of the invention are set forth in the accompanying drawings and the description below. Other features, objects, and advantages of the invention will be apparent from the description and drawings, and from the claims.

DESCRIPTION OF DRAWING

The single FIGURE is a block diagram of a system for indicating the integrity of data as such data passes through a FIFO in accordance with the invention.

DETAILED DESCRIPTION

Referring now to the Figure, a system 10 is shown for indicating information, here data, integrity as such data passes through a FIFO 12. The FIFO 12 here includes a shift register section 14 having a plurality of successively coupling register stages $16_1$-$16_m$. The data is pushed into input register stage $16_1$ from a data source 18 and passes through such the stages of the shift register section 14 to an output register stage $16_m$ in response to shift signals. The shift signals are produced in any conventional manner by a conventional FIFO controller 20 in response to a clock signal, CLK, pushed into the FIFO 12 by a clock 22. The output register stage $16_m$ is coupled to a data destination 19.

More particularly, during normal operation, the data source 18 produces n bits of data, synchronous with the CLK signal. The data, here n bits, produced by the data source 18 are written into the FIFO 12, here designated as a data FIFO, in response to a PUSH_1 command produced by a source controller 24 in a conventional manner. The written n bits are indicated by the designation "1" through "n" in stage $16_1$ of the shift register section 14. During a read operation, a POP_1 signal is produced by a source controller 24 in a conventional manner. A FIFO controller 20, in response to the POP_1 command produces a POP_ENABLE signal and the read address, here stage $16_1$-$16_m$, designation that points to address here, stage $16_1$-$16_m$ storing the oldest data in the FIFO 12.

During normal operation, the n bits of data produced by the data source 18 are also pushed into a parity generator 24. Also fed to the parity generator 24 is the clock signal CLK. Either even or odd parity calculation are used as long as it is used consistently thoughout the process. There is one parity bit produced for each byte of data produced by the data source 18. Thus, there are n/8 parity bits produced, such bits being indicated by the designation "$PTY_1$" through $PTY_{n/8}$ in stage $16_1$ of the shift register section 14.

Thus, if even parity is to be used, if the number of say logic 1 bits within a given data byte is an even number, then the generated parity is not asserted (i.e., here a logic 0 is associated with the given byte); otherwise, the parity is asserted (i.e., here a logic 1 is associated with the given byte). On the other hand, if odd parity is to be used, if the number of say logic 1 bits within a given data byte is an odd number, then the generated parity is not asserted (i.e., here a logic 0 is associated with the given byte); otherwise, the bit is asserted (i.e., here a logic 1 is associated with the given byte).

The parity produced at the output register stage $16_m$ of shift register section 14 is checked by a parity checker 25, such parity checker 25 also being fed the data provided at the output register stage $16_m$ of the FIFO 12 and the clock signal, CLK, as indicated. Thus, if the data pushed into the FIFO 12 has associated even parity, and the data popped out of the FIFO does not have associated even parity, an error is detected by the parity checker 25. Likewise, if the data pushed into the FIFO has associated odd parity, and the data popped out of the FIFO does not have associated odd parity, a parity error is detected by the parity checker 25. The parity error or lack thereof is indicated as an output of the parity checker 25. Thus, this parity mechanism ensures that each data byte has not been corrupted due to single, triple, quintuple, or septuple-bit electrical or logical faults.

Having both even/odd parity generation and even/odd parity checking capabilities provides a mechanism by which the integrity of the parity generation and checking circuits themselves can be verified.

This is accomplished as follows during an initial test mode: Odd parity is generated on the data from source 18 and pushed into the FIFO 12 with such data. Even parity is checked when the data and data parity are popped from the FIFO 12 in response to a POP_1 command produced by a destination controller 30 in a conventional manner. If the parity generation and checking circuits 24, 25 are performing correctly, this action should produce a parity error associated with each and every data byte. Similarly, if even parity is generated on the data and pushed into the FIFO with the data and odd parity is checked when the data and data parity are popped from the FIFO, then this action should produce a parity error associated with each and every data byte. This action verifies that the parity generator 32 and parity checker 25 do not have "stuck-at" electrical faults or logical implementation errors. The test mode determines whether the checker 25 is able to produce a proper parity error signal.

Referring again to the normal operating mode subsequent to the initial test mode, the data, data parity, packet delimiter (to be described), and frame delimiter information (to be described) that is pushed into the FIFO 12 in one clock (CLK) cycle is referred to as a packet. Thus, it is noted that the packet indicted in stage $16_1$ from source 18, the n/8 parity bits $PTY_1$ through $PTY_{n/8}$, a packet delimiter bit, to be described, in the MSB-1 bit position and a frame delimiter bit to be described in the MSB bit position. A set of one or more packets is referred to as a frame. Thus, the packets within a frame are pushed into the FIFO 12 on successive clock cycles.

The system 10 includes a packet delimiter generator 26. The packet delimiter generator 26 responds to the clock signal, CLK, and the PUSH_1 signal produced by the source controller 24 each time a packet of data from source 12 is to be stored in the input register stage $16_1$ of the shift register section 14. That is, the PUSH_1 signal is a control signal that indicates that the source controller 24 is attempting to write data into the FIFO 12. The packet delimiter generator 26 appends a tag to the data from source 12 and the parity bits produced by the parity generator 24. A given packet delimiter tag has a value that is different from the value appended by the packet delimiter generator 26 to the adjacent packets.

Thus, the packet delimiter generator 26 creates a tag, synchronous with the clock signal, CLK. The logic value of the tag alternates with each packet successively pushed into the input register stage $16_1$. Each packet is, as noted above, pushed into the input register stage $16_1$ of the shift register section 14 in response to a clock signal, CLK. In the example shown in the FIGURE, the tag is pushed into a predetermined bit location MSB-1 where the bit position MSB is the most significant bit position of each stage of the shift register section 14. Thus, it is noted that the logic value of the tag in every other one of the register stages, here stages $16_1$, $16_3$, and $16_5$ are the same logic value, i.e., logic value 1 while the intermediate stages, here stages $16_2$, $16_4$, are the same logic value, i.e., logic value 0.

The system includes a packet delimiter checker 28 that is coupled to the output register stage $16_m$ of the MSB-1 of the shift register section 14. The FIFO controller 20 is fed the POP_ENABLE signal produced by the FIFO controller 20 in response to a POP_1 signal produced by the destination controller in any conventional manner. The POP_ENABLE signal is a control signal that indicates that the destination controller 30 is attempting to read data from the FIFO 12.

The packet delimiter checker 28 provides an indication of the whether the logic value of the tag alternates as such data is successively popped from the FIFO 12, synchronous with the clock signal, CLK. Thus, if the logic value of the tag alternates when successive pops are executed, there is no packet error produced by the packet delimiter checker 28; otherwise, an error signal is produced at the output of the packet delimiter checker 28.

Thus, it is noted that with packet delimiter generation by packet delimiter generator 26, the FIFO 12 generates a single-bit packet delimiter for each packet that is pushed into the FIFO 12 by the source generator 24. The value is stored in the MSB-1 bit position of the packet. As noted above, the logic value for this delimiter is the opposite of the delimiter value that was generated for the previous packet. Thus, the logic pattern that the FIFO 12 generates for the delimiter for successive pushed packets is 01010101, etc. The packet delimiter bit is part of the packet that is pushed into the FIFO 12.

When the destination controller 30 pops a packet from the FIFO 12, the packet delimiter checker 28 checks the logic value of the packet delimiter tag to check whether it is the opposite of the packet delimiter value in the previous packet that was popped from the FIFO 12. If the logic value for the delimiter tag in two adjacent packets is the same, then the FIFO 12 reports a packet error.

This packet delimiter mechanism attempts to ensure that the FIFO 12 did not erroneously overwrite a previously pushed packet. Since half of the packets contain a delimiter that has a logic value 1 and the other half contain a logic value 0, this mechanism can detect half of the potential FIFO addressing errors.

The system 10 also includes a frame delimiter generator 32. The frame delimiter generator 32 appends a tag to each packet within a frame in response to an END Of FRAME signal produced by the source controller 24. The tag, here a bit, is fed to the MSB bit position of the packet. Within a frame, a frame delimiter tag has a value that is different from the tag value of the frame delimiters in the adjacent frames.

More particularly, a frame delimiter generator 32 is provided for appending a tag in a predetermined bit location, here the MSB position, for each packet of the data pushed into the input register stage $16_1$ synchronous with the clock signal, CLK. The appended tag has the same logic value for each packet within the frame. The appended tag alternates in logic value for successive frames pushed into the input register stage $16_1$ of the shift register section 14. Each one of the frames is comprised of at least one packet of the data. Each one of the packets of data is pushed into the input register stage $16_1$ of the shift register, synchronous with the clock signal, CLK. Thus, in the example shown in the FIGURE, frame p contains a set of two packets. The frame delimiter tag has a value of logic 0 for each of the two packets in such frame, p; the succeeding frame p+1 contains a set of two packets where the frame delimiter tag has a value of logic 1 for each of the two packets in such frame, p+1; and the next succeeding frame p+2 contains a single packet where the frame delimiter tag has a value of logic 0 for the packet in such frame, p+2.

The system 10 includes a frame delimiter checker 42 for providing an indication of the whether the logic values of the tag produced at the output register stage $16_m$ in the predetermined bit location for one of the frames pushed into the input stage of the shift register alternates from the succeeding one of the frames, such frames being successively produced at the output stage in response to the clock signals.

More particularly, the frame delimiter checker 42 provides an indication of whether the logic values of the tag produced at the output register stage $16_m$ in the predetermined bit location, here the MSB location, for one of the frames pushed into the input stage $16_1$ of the shift register section 14 alternates from the succeeding one of the frames, such frames being successively produced at the output stage $16_m$, synchronous with the clock signal, CLK.

The system includes a second FIFO 40 fed frame size data by the source controller 24. The second FIFO is designated as a control FIFO and is identical in construction to the data FIFO 12. Here, however, the second FIFO 40 is not fed a frame delimiter tag and hence the MSB bit of FIFO 40 is not used. The pop (i.e., write) and push (i.e., read) signals fed to the second FIFO are designated POP_2 and PUSH_2, respectively, and are produced by the source controller 24 and the destination controller 30, respectively, as indicated.

The frame size data passes through the second FIFO 40 in response to the clock signals CLK. The frame delimiter checker 42 in response to the frame size data passed thereto through the second FIFO 40.

More particularly, with frame delimiting, the frame delimiter generator 32 generates a single-bit frame delimiter for each frame that is pushed into the FIFO 12 by the source controller 24. The source controller 32 provides a signal to the destination controller 30 that indicates when the frame ends, i.e., a multi-bit frame word indicating the size, that is, the number of packets in a frame. This multi-bit word of frame size information is fed by the source controller 24 to the second FIFO 40. More particularly, the frame size information is pushed into the second FIFO 40 which responds to the clock signals as FIFO 12.

The logic value for a generated frame delimiter produced by frame delimiter generator 32 at the end of each frame is the opposite of the frame delimiter value generated by the generator 32 for the previous frame. Thus, the logic pattern that the frame delimiter generator 32 generates for the delimiter tags for successive pushed frames is 01010101, etc. The frame delimiter tag is contained in each packet that is pushed into the FIFO 12.

The frame delimiter checker 42 is responsive to an end of frame signal produced by the destination controller 30 in response to the frame size information such controller 30 receives from the second FIFO 40. In response to such end of frame signal and clock signals CLK, the frame delimiter checker 42 verifies that the logic value of the frame delimiter remains constant for all packets within a frame. Thus, the source controller 30 provides an end-of-frame signal to the destination controller 30 that indicates when the destination controller 30 should expect the frame to end. If the frame delimiter checker 42 detects that the frame delimiter value varies within the frame, the frame delimiter checker 42 reports a frame error. The frame delimiter checker 42 also verifies that the frame delimiter value in a given frame is the opposite of the frame delimiter value in the previous frame that was popped from the FIFO 12. If the logic value for the delimiter in two adjacent frames is the same, then the frame delimiter checker 42 reports a frame error.

The frame delimiter mechanism ensures that the source controller 24 and the destination controller 30 are in agreement as to the size of the frames (the number of packets in each frame).

It is also noted that the FIFO 12 includes a push checker 50 and a pop checker 52. The push checker 50 is responsive to the PUSH_1 signal and the address produced by the FIFO controller 20. With this arrangement, the push checker 50 reports a push error when the source controller 24 attempts to push a packet into a FIFO that is full, i.e., when there are no addresses available. This mechanism ensures that the FIFO will not drop a packet without an error being reported.

Likewise, the pop checker 52 is responsive to the POP_2 signal and the address produced by the FIFO controller 20. With this arrangement, the pop checker 52 reports a pop error when the destination controller 30 attempts to pop a packet from a FIFO that is empty, i.e., when all addresses are available. This mechanism helps to ensure that the source controller 24 and the destination controller 30 are in agreement about the size of the frames.

By employing all of the above FIFO data integrity mechanisms simultaneously and continuously, the integrity of the data that is pushed into and popped from the FIFO is greatly enhanced.

Thus, the system 10 uses several mechanisms to ensure the integrity of the data provided by the FIFO 12 to the user of such data. These mechanisms, described above, are:
1. parity generation and checking
2. packet delimiter generation and checking
3. frame delimiter generation and checking
4. push and pop checking.

A number of embodiments of the invention have been described. Nevertheless, it will be understood that various modifications may be made without departing from the spirit and scope of the invention. Accordingly, other embodiments are within the scope of the following claims.

What is claimed is:

1. A system for determining information integrity as such information passes through a FIFO, comprising:
   a generator for appending a bit in a predetermined bit location in each packet pushed into the FIFO in response to a clock signal, such appended bit being independent of the information pushed into the FIFO;
   a checker for providing an indication of the information integrity in response to bits produced at an output of the FIFO in the predetermined bit location; and
   wherein the generator is a packet delimiter generator and the checker is a packet delimiter checker.

2. A system for determining information integrity as such information passes through a FIFO, comprising:
   a generator for appending a bit in a predetermined bit location for a frame in each packet pushed into the FIFO in response to clock signals, such appended bit having the same logic value for all packets in the frame;
   a checker for providing an indication of the information integrity in response to bits produced at an output of the FIFO in the predetermined bit location; and
   wherein the generator is a frame delimiter generator and the checker is a frame delimiter checker.

3. A system for determining information integrity as such information passes through a FIFO, comprising:
   a packet delimiter generator for appending a bit in a predetermined bit location of each packet of the information pushed into the FIFO in response to a clock signal, such appended bit alternating in logic value for packets of the information successively pushed into the FIFO, each one of the packets of information being pushed into the FIFO in response to the clock signal; and
   a packet delimiter checker for providing an indication of the whether the logic value of the bits produced at an output of the FIFO in the predetermined bit location alternates as such information is successively produced at the output stage in response to the clock signal.

4. A system for indicating data integrity as such data passes through a FIFO, comprising:
   a frame delimiter generator for appending a bit in a predetermined bit location of each packet of the data pushed into the FIFO in response to clock signals, such appended bit having the same logic value for each packet within a frame of the data, such appended bit alternating in logic value for frames of the data successively pushed into the FIFO, each one of the frames comprising at least one packet of the data, each one of the packets of data being pushed into the FIFO in response to a clock signal; and a frame delimiter checker for providing an indication of the whether the logic values of the bits produced at an output of the FIFO in the predetermined bit location for one of the frames pushed into the FIFO alternates from the succeeding one of the frames such frames are successively produced at the output of the FIFO in response to a plurality of the clock signals.

5. The system recited in claim 4 including a second FIFO fed frame size data and wherein such frame size data passes through the second FIFO in response to the clock signals, and wherein the frame delimiter checker is response to the frame size data passed thereto through the second FIFO.

6. A method for indicating information integrity as such data passes through a FIFO, comprising:

feeding the information to the FIFO;

appending a bit in a predetermined bit location of each packet of the information pushed into the FIFO in response to a clock signal, such appended bit being independent of the information pushed into the FIFO;

providing an indication of the information integrity on response to bits produced at an output one of the FIFO in the predetermined bit location; and wherein the appending comprises appending a packet delimiter bit and the indication providing comprises examining the appended packet delimiter bit.

7. A method for indicating information integrity as such data passes through a FIFO, comprising:

feeding the information to the FIFO;

appending a bit in a predetermined bit location of each packet of the information pushed into the FIFO in response to a clock signal, such appended bit having the same logic value for all packets in the frame;

providing an indication of the information integrity on response to bits produced at an output one of the FIFO in the predetermined bit location; and wherein the appending comprises appending a frame delimiter set of bits and the indication providing comprises examining the appended set of frame delimiter bits.

8. A method for indicating information integrity as such information passes through a FIFO, comprising:

feeding the information to a FIFO;

appending a bit in a predetermined bit location of each packet of the information pushed into the FIFO in response to a corresponding one of a plurality of clock signals, such appended bit alternates in logic value for packet of the information successively pushed into the FIFO, each one of the packets of data being pushed into the FIFO in response to a corresponding one of the clock signals;

providing an indication of the whether the logic value of the bits produced at an output of the FIFO in the predetermined bit location alternates as such information is successively produced at the output of the FIFO in response to the clock signals.

9. A method for indicating data integrity as such data passes through a FIFO, comprising:

feeding the data to a FIFO;

appending bits in a predetermined bit location of each packet of the data pushed into the FIFO in response to a corresponding one of a plurality of clock signals, such appended bit having the same logic value for each packet within each frame of the data, such appended bits alternating in logic value for frames of the data successively pushed into the FIFO, each one of the frames comprising at least one packet of the data, each one of the packets of data being pushed into the FIFO in response to a corresponding one of the clock signals;

providing an indication of the whether the logic values of the bits produced at an output of the FIFO in the predetermined bit location for one of the frames pushed into the FIFO alternates from the succeeding one of the frames such frames are successively produced at the output of the FIFO in response to the clock signals.

10. The method recited in claim 9 including wherein frame size data passes through a second FIFO in response to the clock signals, and wherein the indication providing comprises responding to the frame size data passed thereto through the second FIFO.

* * * * *